United States Patent
Van Der Valk

(10) Patent No.: US 6,795,520 B2
(45) Date of Patent: Sep. 21, 2004

(54) HIGH SPEED DIGITAL COUNTERS

(75) Inventor: Robertus Laurentius Van Der Valk, Dordrecht (NL)

(73) Assignee: Zarlink Semiconductor Inc., Kanata (CA)

( * ) Notice: Subject to any disclaimer, the term of this patent is extended or adjusted under 35 U.S.C. 154(b) by 0 days.

(21) Appl. No.: 10/355,903

(22) Filed: Jan. 31, 2003

(65) Prior Publication Data

US 2003/0169841 A1 Sep. 11, 2003

Related U.S. Application Data

(60) Provisional application No. 60/352,550, filed on Jan. 31, 2002.

(51) Int. Cl.[7] .............................................. H03K 21/16
(52) U.S. Cl. ...................... 377/115; 377/114; 377/104
(58) Field of Search ................................ 377/115, 114, 377/104

(56) References Cited

U.S. PATENT DOCUMENTS 5,425,074 A * 6/1995 Wong .......................... 377/47

* cited by examiner

*Primary Examiner*—Margaret R. Wambach
(74) *Attorney, Agent, or Firm*—Lawrence E. Laubscher, Jr

(57) ABSTRACT

A high speed digital counter consists of a chain of asynchronous counter cells. Each cell includes a flip-flop with a master latch and a slave latch and a clock gating circuit. The clock gating circuit derives an enable input from an output of the master latch.

18 Claims, 9 Drawing Sheets

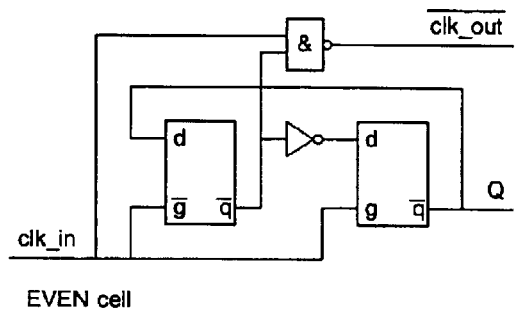
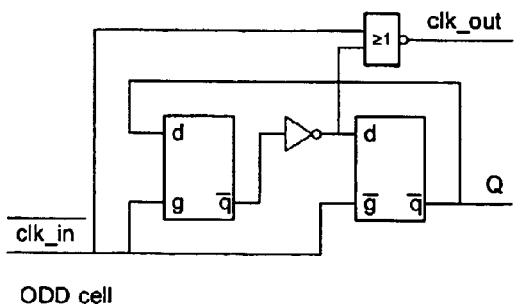
FIG. 11A          FIG. 11B
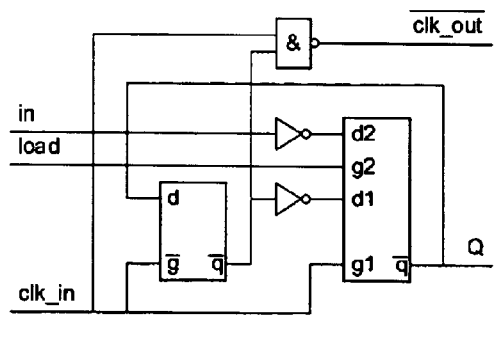
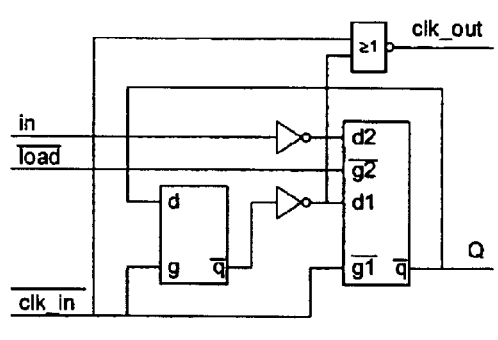
FIG. 12A          FIG. 12B
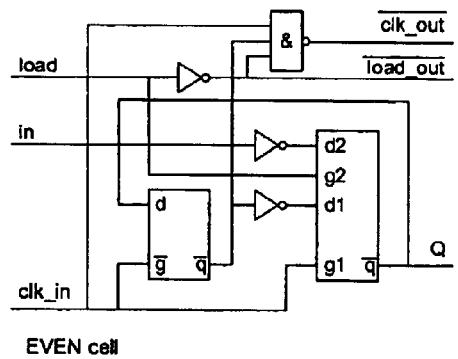
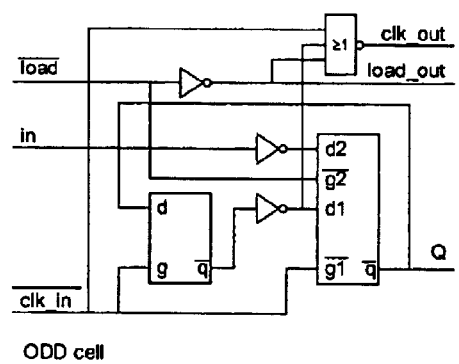
FIG. 13A          FIG. 13B

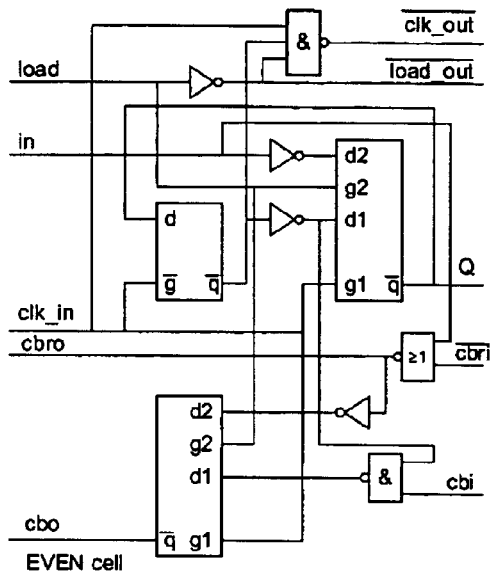 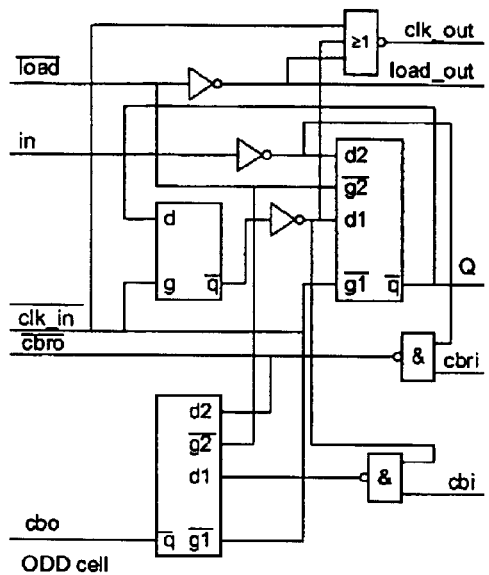
FIG. 14A    FIG. 14B
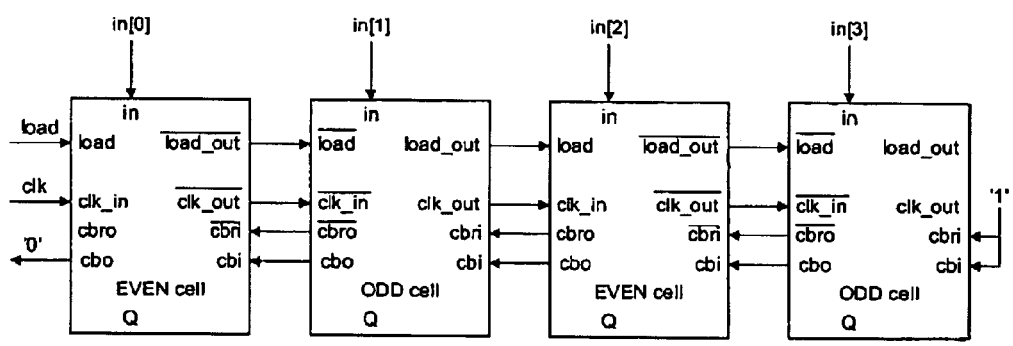
FIG. 15

HIGH SPEED DIGITAL COUNTERS

CROSS REFERENCE TO RELATED APPLICATIONS

This application claims the benefit of U.S. provisional application serial No. 60/352,550 filed on Jan. 31, 2002, the contents of which are herein incorporated by reference.

FIELD OF THE INVENTION

This invention relates to the field of digital signal processing, and in a particular to a method and apparatus for implementing a high-speed, counter, and in particular, but not exclusively, a multi-modulo counter.

BACKGROUND OF THE INVENTION

Counters may be used to count operations, quantities, or periods of time. They may also be used for dividing frequencies, for addressing information in storage, or for temporary storage. They are typically used in phase locked loop circuits. Counters consist of a series of flip-flops connected together to perform the type of counting desired. They can count up or down by ones, twos, or more.

The total number of counts or stable states a counter can indicate is called the modulus. The term modulo is used to describe the count capability of counters; that is, modulo-16 for a four-stage binary counter, modulo-11 for a decade counter, modulo-8 for a three-stage binary counter, and so forth.

There are two basic types of counter: synchronous and asynchronous. Synchronous counters typically consist of a chain of JK flip flops. The input clock pulses are applied to each flip flop. The output count is taken from the Q output of each flip flop. A high is asserted on the J and K inputs of the first flop-flop to ensure that this flip flop toggles on the falling edge of the clock pulses. Additional gates are added to ensure that the flip-flops toggle in the proper sequence. In a synchronous counter, the flip flops all toggle at the same time at the clock frequency. This arrangement prevents errors, but also results in a relatively high power consumption, especially at high frequencies. In modern communications circuits, such as for SONET circuits, clock frequencies of 600 MHz are common, and at such frequencies power consumption can be unacceptably high.

In synchronous circuits, the maximum speed is set by the combinatorial logic between a register output and a register input and the internal register hardware. Synchronous circuits require more interconnectivity. This creates extra gate loads and wire loads on drivers. This requirement limits the maximum theoretical speed for synchronous designs. A 16 bit high speed counter requires careful design of ripple and carry look-a-head structures. The least significant bit, which is also the fastest in its output rate, controls many nodes. Without a buffer the load for the driver is high, with a buffer the buffer load is still high, and the buffer introduces delay.

While synchronous circuits can be pipelined, which more or less avoids the previous loading problem, this is done at the cost of a tremendous hardware overhead. This in turn translate into high power consumption and real estate usage. In addition, some situations do not allow pipelining, for instance, the need for short duration feedback loops.

Ripple counters are so named because the events (setting and resetting of the flip flops) occur one after the other rather than all at once. The count is asynchronous, it can produce erroneous indications when the clock speed is high due to race effects. A high-speed clock can cause the lower stage flip flops to change state before the upper stages have reacted to the previous clock pulse. The errors are produced by the inability of the flip flops to keep up with the clock. Prior art ripple counters are not suitable for use at frequencies in the 600 MHz range. However, because the downstream flip flops are effectively being clocked at a lower rate, the power consumption of ripple counters is relatively low compared to synchronous counters.

SUMMARY OF THE INVENTION

The invention relates to novel high speed, multi-modulo counters based on ripple counters that are useful for high speed operations. This permits a reduction in power consumption relative to synchronous counters. In certain applications, the high speed performance of the asynchronous counters in accordance with the invention can approach that of synchronous counters.

The ripple counters in accordance with embodiments of the invention are suitable for use in phase locked loops, for example, in SONET chips. Such counters inherently have a lower power consumption and extremely high speed. A typical maximum speed is determined by the delay of a normal optimized T-flip-flop plus two NAND2 gates.

According to the present invention there is provided a high speed digital ripple counter comprising a chain of counter cells comprising a first counter cell and a series of subsequent counter cells, each of said first counter cell and said subsequent counter cells comprising a filp-flop having a master latch and slave latch, each said master and slave latch being provided with data and gating inputs: each said subsequent counter cell including a gating circuit having an output supplying gated clock signals to the gating inputs of the master and slave latches associated with that counter cell; each said gating circuit of said subsequent counter cells having a first input connected to receive signals applied to the gating inputs of the preceding counter cell and an enable input connected to an output of the master latch of the preceding counter cell; and a clock input for providing clock signals to the gating inputs of said first counter cell.

Clock gating can be employed to spread the active edges in time. This in turn spreads the load on the supply lines, which is in general good for a chip, creating less problem with noise, electromigration, and permitting the use of smaller supply lines etc.

By taking the clock signal from the output of the master latch, problems due to race effects in ripple counters can be overcome.

BRIEF DESCRIPTION OF THE DRAWINGS

The invention will now be described in more detail, by way of example only, with reference to the accompanying drawings, in which:

FIGS. 11*a* and 11*b* are block diagrams of cells for a multi-modulo counter that avoid the use of AND gates;

FIGS. 12*a* and 12*b* are block diagrams of loadable cells;

FIGS. 13*a* and 13*b* are block diagrams of basic loadable cells with clock extinction;

FIGS. 14*a* and 14*b* are block diagrams of loadable cells with carry preparation;

FIG. 15 is a block diagram of a 4-bit multi-modulo counter;

DETAILED DESCRIPTION OF THE PREFERRED EMBODIMENTS

Figure 1:
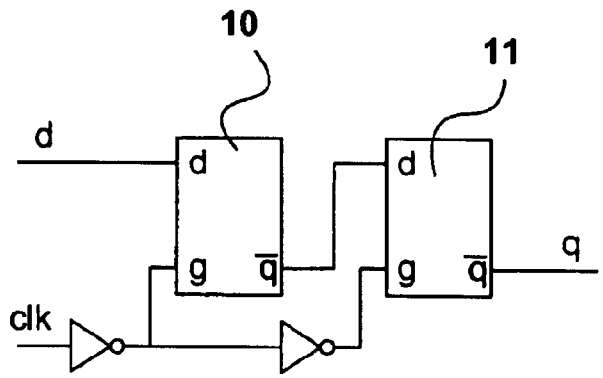
FIG. 1 is block diagram of a master latch for a counter cell.

A brief discussion of latches will be helpful in understanding the invention. Latches are used to build a flip-flop, which normally consists of a master 10 and a slave latch 11 as shown in FIG. 1. The master-slave arrangement ensures that the output of the slave latch 11 toggles on the falling edge of the clock signal.

Figure 2:
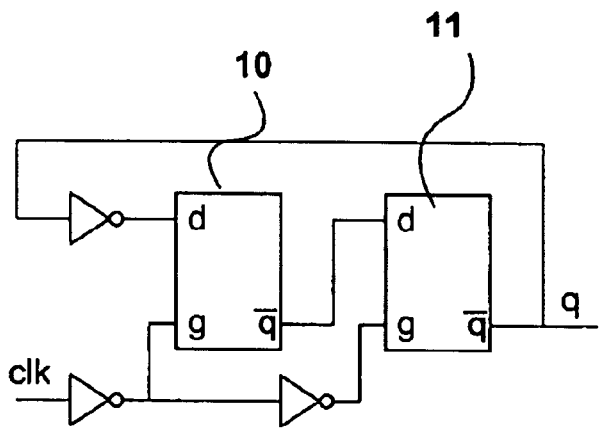
FIG. 2 is a block diagram of a toggle flip flop.

In the structure shown in FIG. 2, the input of the master latch comes from the output of the slave latch. The master latch is gated when the system clock is low, and the slave latch is gated when it is high. It is also apparent from FIG. 2 that the same timing requirements exist between flip-flops as between latches. The separation between the master latch output and slave latch input is not different in principle from the separation between slave latch output and master latch input.

Figure 3:
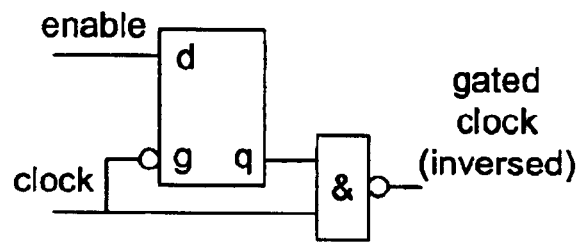
FIG. 3 is a block diagram of a clock gating circuit.
Figure 4:
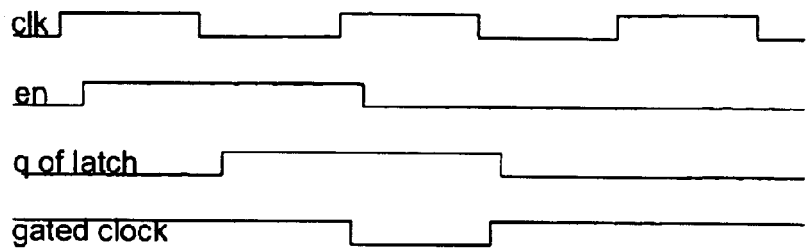
FIG. 4 is a timing chart for the clock gating circuit shown in FIG. 3.

Some means must be provided to provide clock gating for the latch. The traditional problem in clock gating is the provision of a good clock gate signal. A gating circuit is shown in FIG. 3. In accordance with the principles of the invention, the signal that determines whether to pass the pulse is taken from a master latch. At the beginning of the high pulse, the master latch goes into hold, and is thus stable. As a result no spikes will appear and the circuit will generate good gate signals. The only limit that must be obeyed is at the end of the high-pulse. At this instant, the master latch could change its value, causing spikes to appear. Fortunately, the clock pulse disabling the gating logical structure will arrive before the master latch can start to change its output. The delay of the clock directly into the clock gate is always very small, and much smaller than the delay through the latch. This condition must be enforced under all circumstances so that the gate structure must be close to the latch and the clocks. The length of the wire between clock and the NAND gate should be short. The timing relationships are shown in FIG. 4. As will be seen, the gated clock signal starts on the falling edge of the enable signal.

Figure 5:
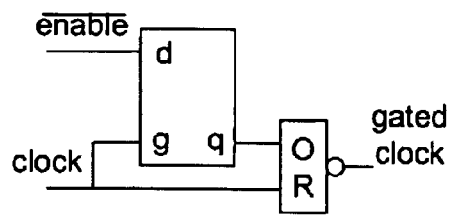
FIG. 5 is a block diagram of a second clock gating circuit.

The gating circuit shown in FIG. 5 generates an inverted gated clock signal. It is of course straightforward to invert this signal to normal positive logic. But it is also possible to let the following element have an inverse clock input, so that the extra inversion can be omitted. This reduces power and delay. By changing the relevant polarities, especially the gate sensitivity, the circuit can be made to pass the low pulse rather than the high pulse.

If the high pulse is the element to be filtered, the master latch will be the control. If the low pulse is the element to be filtered, a slave latch is to be used. However, if the driving clock is also inverted, the apparent slave latch actually becomes a master latch. The use of the positive clock pulse can be reformulated as using gated clocks and inverted gated clocks, with enable signals from master latches. This solution is consistent since all master latches freeze when a clock pulse arrives.

Figure 6:
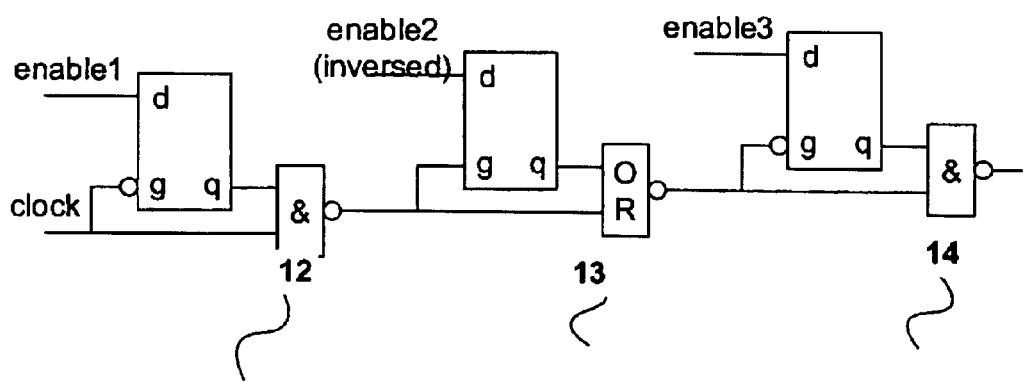
FIG. 6 is a block diagram of a third clock gating circuit.

In the following circuits, subsequent stages use inverted clocks. Thus a sequence of building blocks will have a series of gating clock circuits as shown in FIG. 6. The first block 12 gates the clock for the second block 13, which gates the clock for the third block 14 etc. The sequence of NAND-NOR gates can be viewed as one large series AND, with convenient inversions at some places. Due to the clock inversions all latches are in effect master latches.

Figure 7:
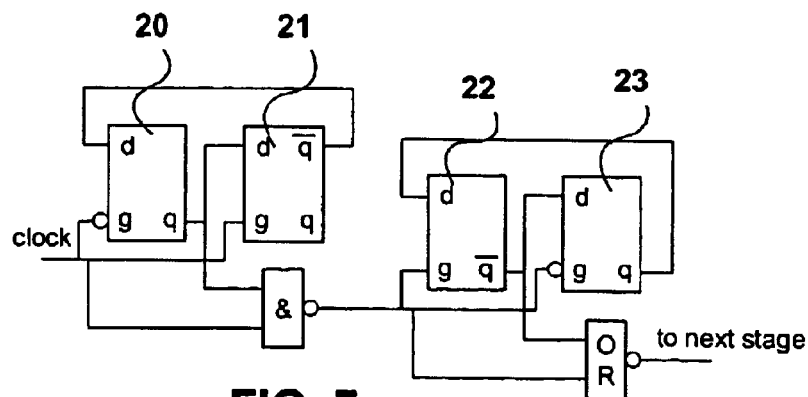
FIG. 7 is a block diagram of a 2-bit ripple counter.

Referring now to the ripple counter shown in FIG. 7. This consists of flip flops 20, 21, 22, 23. The first block 20 performs a toggle function and uses the next value to indicate whether there is a carry into the next section. If there is a carry, the clock is enabled and the next cell will count. Each flip-flop has a data input d, a gating input g, and outputs q and q bar as known in the art per se.

In operation, the first counter section 20 toggles; the d signal is a feedback signal from the inverted output q. If the first master latch is set at 1, the clock signal is passed on to the next stage. This indicates that the construction is a down counter; if the master is 1, the slave will follow that (half a cycle later) and also become 1. A carry in that condition is equivalent to a down counter. The connection between the first counting cell and the second one can be chosen to have only one line, being the gated clock. This is a more compact arrangement than is possible with any synchronous multibit counter.

The second counter stage 21 is subtly modified. The gate sensitivities are inverted since the clock signal is inverted (no inverter after NAND). But also the enabling signal is now 'active' when 0, for the gate is a NOR. This means that the clock passes when the q output of the latch is 1, so again the counter bit is a down counter.

Of course, it will be understood that this principle can be extended to longer counters. There is one important consideration in that the chain of NAND/NOR structures will slightly change the size of the pulses. Both NAND and NOR gates have some difference in rise and fall times, and matching is nearly impossible to achieve, although the alternation of NOR and NAND gates does help. It is important that the ripple chain of flip flops makes the pulses longer. This is not usually a problem since the further along the chain, the lower the ripple rate will be as the counters act as frequency dividers.

It is quite often believed by those skilled in the art that ripple up/down counters are either difficult to make or use much more memory elements than needed. An up/down counter can of course be formed by two counters, one counting up, the other counting down, and a trailing adder. Such a structure, however, has several undesirable properties, such as increased size (about a factor 3), no natural way to build in a limiter, and implementation. It requires two memories.

Figure 8:
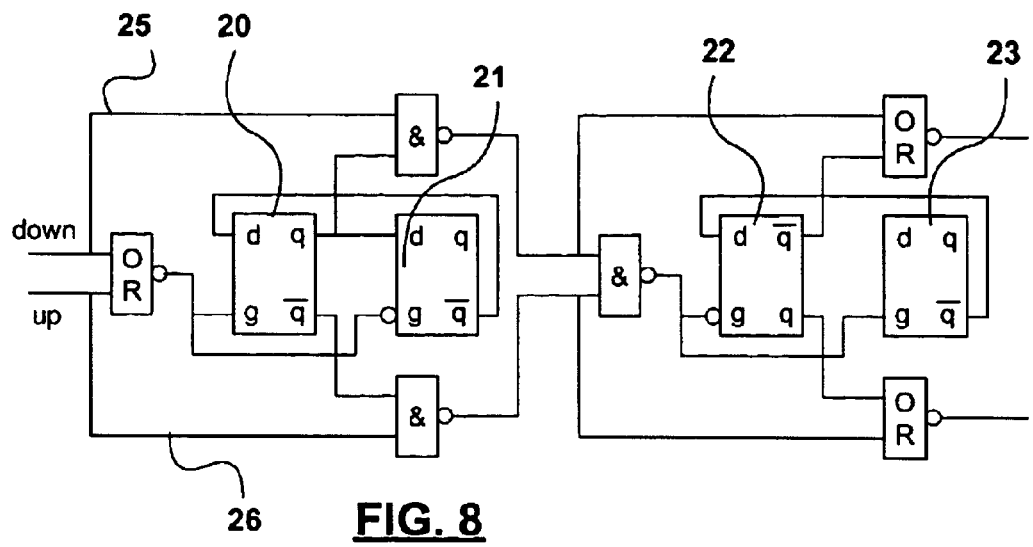
FIG. 8 is a block diagram of an up/down ripple counter.

FIG. 8 shows a two bit counter ripple up/down counter embodying the principles of the invention discussed above.

This counter has two clock ripple chains 25, 26, each of which handles a clock. The bottom chain handles a clock pulse for the high direction, the upper string for the low direction. There is only one limitation for the whole arrangement. The high and low pulses should not arrive at the same moment. The pulses should be mutually exclusive by nature, or else require an arbiter will be required. An arbiter can relatively simple be made with the help of two master latches and controlling hardware before the latches, plus two gates to drive either up or down. Such up/down counters are very useful in power limited instrumentation applications. In high frequency applications phase detectors may put such circuits to good use.

In the designs discussed so far, the clock is not always present throughout the circuit. There are situations where it is a requirement that elements are initialized without a clock pulse. One solution is to send the initialization signal through a master latch and make it part of the clock propagation. Another solution is to make sure that the clock is not present upon reset/load. Each non-clocked flip-flop is in a defined mode, and a reset or load can be executed within the flip-flop.

Figure 9:
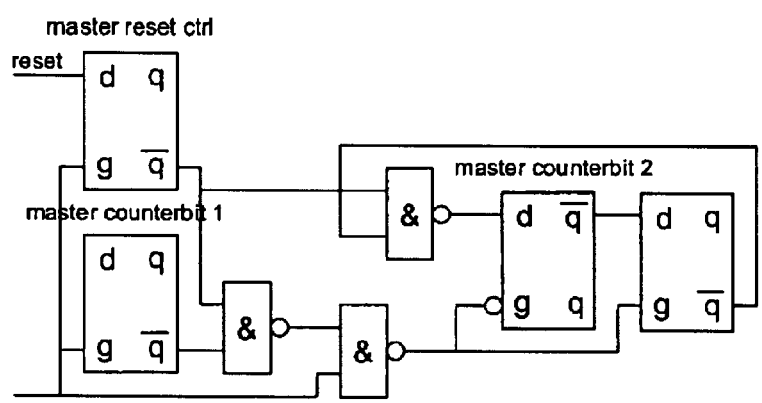
FIG. 9 is a block diagram of a counter with a forced clock.

Forcing a clock during resetting or loading is possible, but is in general not enough to reset a circuit. Instead the elements data input must be controlled also, so that the input becomes known. In such an approach, the data is forced to a known state and to make sure there is a clock. Such an arrangement is shown in FIG. 9. The master reset ctrl signal is a master latch that drives the reset values. The master counter bit indicates the beginning of the ripple chain. The master latch of counter bit 2 uses both a clocked gate and reset data.

For large counters the load signal through the clock gates may imply some delay, which grows when deeper in the gate string. The load signal must remain more or less aligned with the signal, so that the data reset does arrive before the forced clock pulse begins. This can be achieved by using the output of the master latch that controls the clock enable. This will be present about a ½ cycle before the clock arrives. The load signal may also propagate through the flip-flops, just like the gated clock, but faster than the gated clock so that timing relations remain correct. A load signal that propagates slower than the clock signal will have only a ½ clock cycle of delay mismatch before the flip-flops can start to take on wrong values; already clocked where they should be reset.

If the load goes much faster than the clock, a few problems can also arise. The load can catch up with an earlier clock pulse traveling through the ripple chain. Also, the load signal can progress so fast that it ends before the clock arrives. Again this is only a problem with long counterstrings. The best solution is to make the load signal not faster than the clock, but more or less identical. Forcing the clock signal is possible, but requires long clock delay paths proper care of alignment, and will typically reduce the maximum speed that can be achieved.

A latch can be adapted such that it has a truly asynchronous reset, set or load. Driving such a latch to a controlled state is a simple load action. In the case of a counter, if there is no clock, and the slave is set to a certain value, the master will typically follow, and take for instance the opposite value (as in a T flip-flop). Thus the whole memory element becomes known.

In a conventional synchronous design, where typically all flip-flops are clocked, a load or reset is performed by forcing the input of the master latch. In fact, the master latch already follows the input when the clock is low, for then the master latch is open. The slave latch opens upon the arrival of the clock, and then starts to follow the input by following the master latch.

A non-clocked flip-flop will never open its slave latch. Therefore loading of the slave latch, and therewith of the total flip-flop, must necessarily be done within the slave latch. This gives two types of flip-flop's; clocked ones, which are loaded in a more or less synchronous fashion, and unclocked ones, which are loaded in a more or less asynchronous fashion. Of course, loading in a slave latch also carries a few risks. The greatest risk is that where there is supposed to be no clock, there is a clock after all. For loading this may well be the case; the counter is counting and at some moment an external factor creates the necessity for the counter to load. The counter cell may be clocked at that moment.

Disabling the clock upon loading is a good option. If the clock is guaranteed to be not present, there can never be a problem. This solution does require an extra gate for the clock gating, just as for forcing the clock as active. If the clock arrives the slave becomes open and thus sensitive for the feeding master. Whether the resetting is overruling or not depends on the implementation. The load signal must still be present till after the pulse. Thus the load/reset pulse is best generated by a slave latch; that will hold its value till a ½ cycle after the end of the pulse.

The best solution is to disable the clock. In this solution, the clock can be extinguished, so that if there was an undesired clock, it can be disabled. Each stage of clock gating may have its own disabling signal. This is a major advantage because the alignment of clock and load pulse no longer significant. When there is a load, the long clock ripple structures will be extinguished in each cell by clock disabling structures. Since alignment between a signal and no signal is not relevant, the overall alignment becomes void. Thus the load signal can be made as a single parallel load, or a fast ripple string of inverters only. Because the (gated) clock is disabled, the alignment between clock and data is no longer critical.

It is apparent above from the above discussion that initialization can be performed with non gated clocks, gated clocks that are forced on when loading, and gated clocks that are forced off when loading. It is also clear that gated clocks are preferable for their reduced power consumption. Gated clocks that are forced on during initialization require careful alignment of at least three signals (load gating signal, gated clocks, and data inputs). Gated clocks that are forced off during initialization do not have this drawback.

The ripple counters in accordance with embodiments are the invention are thus designed with master latches gating the clock. The system behaves as a normal synchronous system triggered by the positive edge. The positive edge is related to a system level clock, and in individual flip-flops may actually be inverted and a bit delayed compared to the original positive edge. The slave latches may use separate resets or loads if required; if they are not clocked it may be critical.

The ripple counters in accordance with the embodiments of the invention have many advantages. For example, a 16 bit counter will toggle with one flip-flop running at full speed, the next at ½ speed, the next at ¼ speed, and so on. Thus the total will be equivalent to 2 flip-flops running at full speed, instead of 16. Since flip-flops that are clocked with static data still consume loads of power due to their capacitances this is a high power gain.

Power consumption is spread out in time. The clock gating effectively introduces small time offsets between sections, so that toggling is spread quite evenly in some timeframe, instead of falling within the vicinity of one single edge. This has substantial advantages for power supply rejection on other digital and analog parts. No carry tree is required. This reduces hardware resulting in less power usage, and reduces routing overhead (less power again). This also increases the maximum speed.

The outputs of gates route to local nodes only, so nodes within the cell itself or to the direct neighbor. This makes both cell and routing load very low. This spares power and increases the maximum speed.

The use of local connectivity only makes it highly attractive to use minimal size transistors. This is a power and area gain, which results in a higher maximum speed. The actual size may need optimization since the metal wires have no direct relation to the transistors since they are made with different techniques. Sometimes this forces the use of transistors slightly bigger than minimum size.

Due to the reduced transistor and routing cost, the density of the chip can increase, without the cost of extreme measures such as $3^{rd}$. level metal and such. The high density does not directly yield hot-spots; the lower power consumption is responsible for that.

The design of multimodulo counters has in the past been proven to be a complex task. Most multimodulo counters are only 2 modulo counters. They make use of the time during the counting of the first modulo to switch over to the other modulo. This switching over is relatively slow, so that it is for instance related to modulo 63/64 counters or 10/11 counters. For flexible application it is desirable to design counters that are able to perform any modulo operation, including 1, within the structure of an asynchronous counter. This will limit the power consumption while being fully flexible.

As with simple counters, synchronous multi-modulo counters consume large quantities of power, especially the counters that are required for PLL applications. In accordance with the embodiments of the invention, the novel multi-modulo counters are implemented as ripple counters using the design concepts discussed above.

Figure 10:
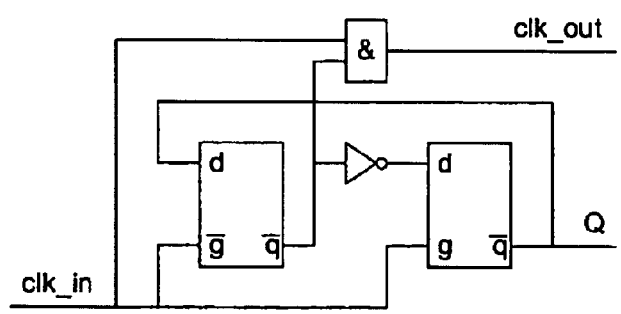
FIG. 10 is a block diagram of a basic cell for a multi-modulo counter.

FIG. 10 gives the block diagram for a single count bit. This can be repeated by simple series connection on the clock inputs and outputs only. The counter output Q is in fact the inverse output of a latch. The latches are always inverting because a latch is fast and low in power consumption in an inverting fashion. The gate of the latches is inverted if the latches are made complementary by the nature of the design, or by using a clock driver for which the slave latch is wired inverse relative to the master latch.

If the output Q is 0, and on the point of becoming 1, the master latch will be open. The inverse q of that latch will thus be 1. Thus the AND will enable the passing of the clock. For a down counter that is correct behavior.

The inversion between the master latch and the slave latch is just as valid as between the slave latch and the master latch. It makes the cell toggle for each clock cycle. However, putting the inverter on the other place necessitates an inverter somewhere else. On the output, in a latch or in the enable of the AND, this is not an attractive option.

The structure can be modified to not use an AND gate, but a series of NANDs and NORs to increase speed. Thus the counter will have odd and even structures as shown in FIGS. 11a and 11b.

The equivalence of the two cells is relatively simple to see. The NAND or EVEN cell yields an inverted clock signal, which is properly picked up by the NOR or ODD cell. The EVEN cell is not really changed compared to the AND cell. The ODD cell works on inverted inputs, which is true for the clock, and is made for the enable input by rewiring inside the cell. Such counter structures are very small in area and wiring, and connectivity between the cells is limited (for these cells) to a single gated clock line.

The timing of the cell has the following requirements. The delay through the two latches and one inverter must be smaller than a single clock cycle. This reflects the toggle loop. The delay through the master latch plus one inverter must be smaller than half a clock cycle. This reflects the properly timed clock gating in the ODD cell. The even cell has a slightly smaller requirement since there the inverter does not play a role.

Loadability can be added next as shown in FIGS. 11a and 11b. The slave latch must be changed to a latch with the normal gating functionality, but with an extra load capability. Since the slave latch will not be gating when loading takes place (for the clock will be chosen to be inactive as stated in earlier paragraphs so that the load gate and the clock gate are mutual exclusive), this can be seen as a second gating signal, with a separate data input. The extra timing requirements for this added functionality are that the load signal must be properly timed relative to the normal clock (A target distance of a half clock cycle is best achievable) and the gating via g2 must be ready in a half cycle. This is less requiring than the requirements for proper clock gating.

The load signal introduces the problem of alignment of clock and load signal. From the circuit it becomes clear that the load requires some inversion only, so that this will be faster than the clock gating, which is made with a slightly more complex cell. The fast load can be designed to eliminate any old clock pulses that are still 'inside' the clock gate string. This must be added for longer ripple strings. At the same time, it is of some importance to observe that the load inversion is best done by an inversion string. The slave latch in reality probably needs the g2 signal both inverted and not inverted (due to the internal structure) so that an inversion is necessary no matter what. Also, an inversion string is again better for spread power consumption and does not require any scaling like a parallel load for all bits would. The diagram should be slightly modified as shown in FIGS. 13a and 19b.

These cells now properly take care of load and clock signal alignment. The connectivity between cells is now two wires which are local between two cells: the gated clock and the load string. The inputs 'in' and the outputs 'Q' are normal binary buses. A typical layout structure associated with these cells would have the ripple strings run horizontally and the input and output buses vertically. An extra buffer (or inverter) may be required to separate the counter timing from the bus timing.

The last part to add for the ODD and EVEN is the carry preparation part. In FIGS. 14a and 14b, the carry preparation is carried out with a ripple string cbr. This is shown as input cbri and output cbro. The carry bit is shown as input cbi and carry output is shown as cbo. It was observed earlier that the concatenation of identical latches may reduce speed. Since the counter is a down counter, the detection of '000000' can be seen as the time series of detection of '0xxxxx', '00xxxx' etc down to '00000x' and '000000'. Since the 0's always become available in sequence, there is enough time to allow use of only a single type of latch. The extra latch must be a slave type to yield 'proper' external timing, i.e. as if the counters try to act as synchronous counters.

The extra latch is fed with an OR (possibly NOR/NAND) of the more significant part of the 0 detector, and the local bit. In the local bit the source is best chosen to be the master latch. The combination of master latch and slave latch is best for timing. The use of a master latch as source for the local bit gives the effect that the input of the 0 detector 'predicts' the impending occurrence of 0. Thus the external appearance of the 0 detector will be as if it is a normal synchronous 0 detector, which is a desirable property.

The cbri/cbro string is the string that actually belongs in the low speed part. The latches are slave latches. If the cbi becomes 1 (more significant part equals 0), the master latch of this flip-flop will effectively carry 1, for this flip-flop will go from 0 to 1. Thus the propagation of the 0 detector will be postponed till also the local bit will become 0.

The timing requirements are now that the combination of the delay of a slave latch and a NAND cell must be smaller than maximally a whole cycle; and the cbri/cbro string must be ready with rippling before the next load happens.

The connectivity between the cells now expands to 4 lines. Of course the cbri/cbro line is in fact in the wrong domain and should not be really counted. All cell connecting lines only hop into the next or the previous cell, so they remain very local. Although this complete structure looks quite complex, it should be realized that it still only contains 3 latches (so 1½ flip-flops) and 6 gate equivalents per bit. The cells can be replaced by their symbols and be concatenated to make a counter structure.

Figure 16:
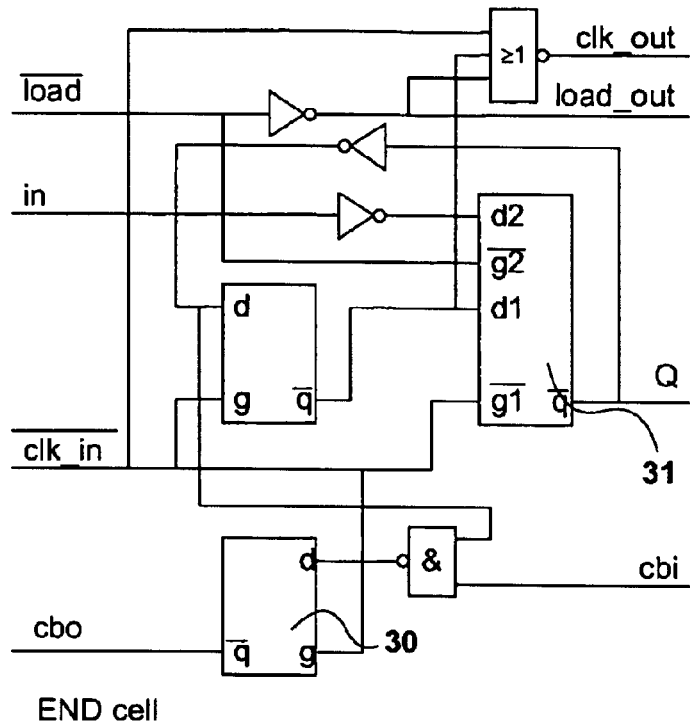
FIG. 16 is a block diagram of an END cell.

FIG. 15 shows a 4-bit counter. If the cells are loaded, the '0' detector is also loaded. Thus the '0' output does not provide the possibility to be used directly as load signal. The external elements such as flip-flops should preferably become asynchronous. But the '0' detector output is in fact from a slave latch, not from a master. These two elements can be conveniently solved by one extra count cell, referred to as the END cell shown in FIG. 16.

This END cell does not have the slave latch for the cbo/cbi generation, but a master latch 30. The master latch is fed from the slave latch 31. For speed this is always optimal. The master latch 30 is not made loadable. Thus the related '0' detector signal is stable at the moment of the active clock, also when it is directly used to load the counter. The loading does happen on the feeding slave latches, so that after the clock pulse on which the '0' is detected the master latch gets the correct (new) value again.

The master latch 30 can be used without slave latch to accommodate clock gating for an external clock enable. Thus an external flip-flop could be designed to toggle upon the '0' detection, force the load action of the counter, and then disable itself again by enabling another clock gate action.

Figure 17:
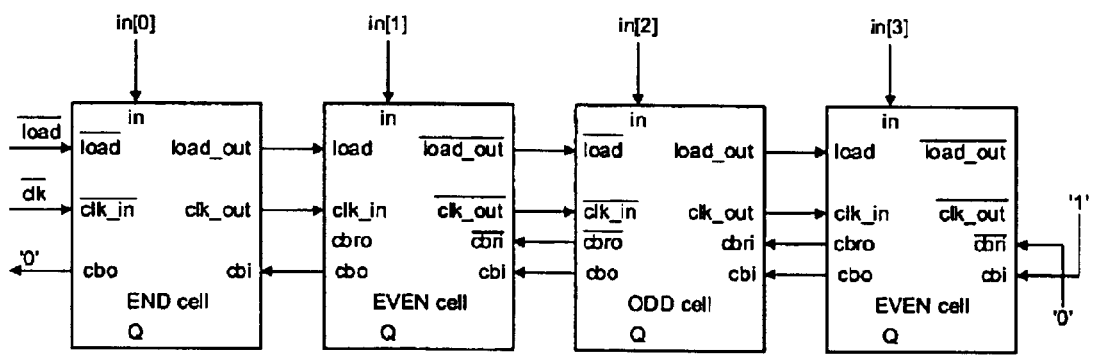
FIG. 17 is a block diagram of a second embodiment of a 4-bit multi-modulo counter.

The END cell is only really different in the way that it handles the smart '0' detector differently. For the rest it has the same kind of architecture as the ODD cell. The new overall structure for a 4 bit counter now would become as shown in FIG. 17.

Figure 18:
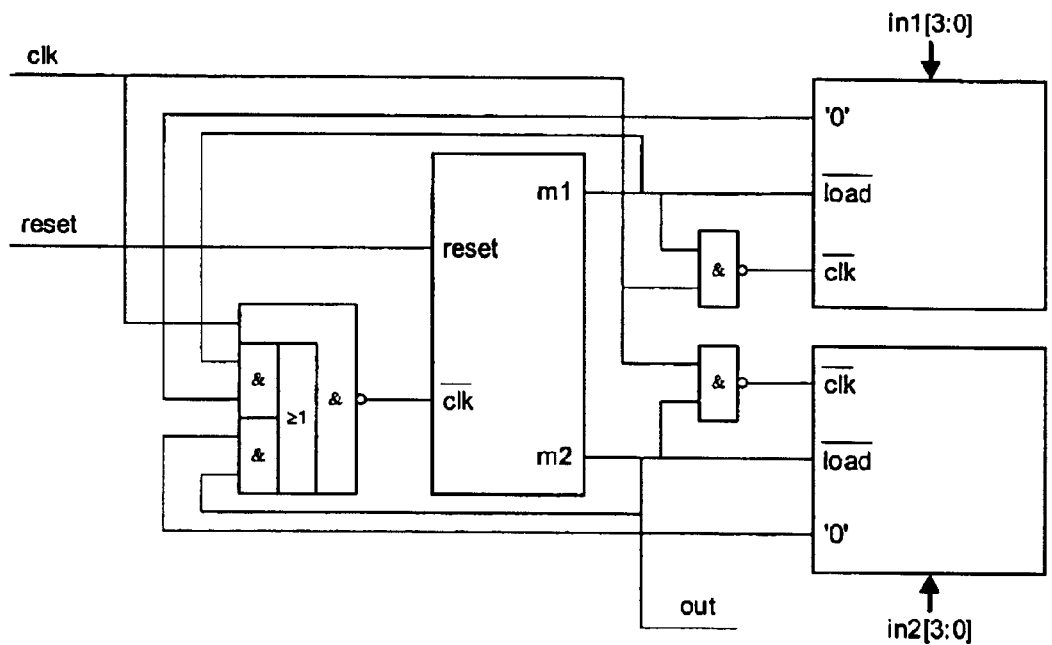
FIG. 18 is a block diagram of a counter structure that counts two values.
Figure 19:
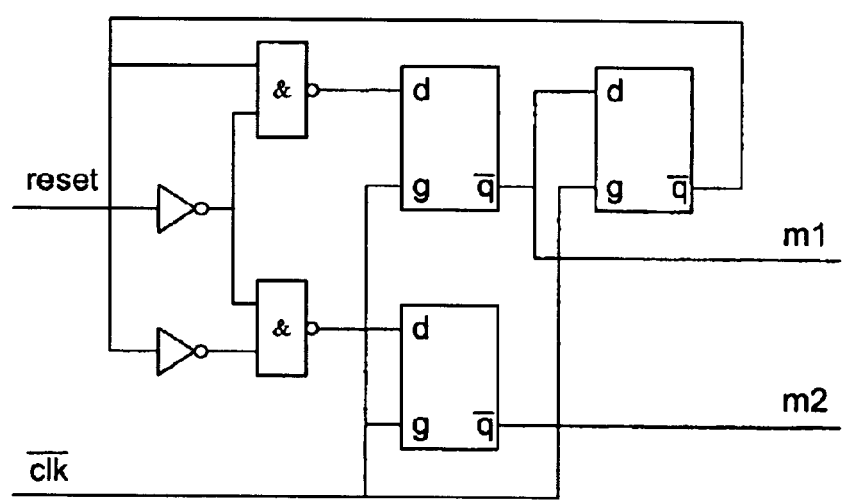
FIG. 19 is a block diagram of a control block for a counter shown in FIG. 18.

An example a counter structure that counts two values is shown in FIG. 18. Such a structure yields a signal that is programmable in its duty cycle, and is programmable in its frequency. The control over the two counters is done from the control block, with outputs that come directly from master latches (for used to gate clocks). The counters are driven in the way of counting OR loading. Upon detection of the 0 position of a counter the clock of the control block is enabled. Thus the control block may step to its other mode. The reset is necessary for initialization. If properly analyzed it can be shown that the reset of the control block must also load the counters. Thus the following block diagram shown in FIG. 19 is relevant for the control block.

The NAND gates 40, 41 are used to reset the master latches 42, 43. This only works when the clock is not active, that is when the system clock is low. At that moment the two latch outputs both become low. After the reset, the occurrence of a clock toggles the topmost slave and master latch. The bottom master latch will track the inverse of the topmost master latch.

It will seen that in the above ripple counters adopt the following rules:

Load on the slave latch:

Gate clock with master latch;

Extinguish ripple signals if required;

When extra speed is needed, alternate the master and slave latches.

At least for simple state machines, the rules give good results with ripple counters. The counters that result have very good speed performance, the timing is kept low; effectively the sum of two latches and at most two gates. Also, all structures are truly asynchronous; all clocks are coming in through a gate. These gates may still require extra current, but proper design of the gates will keep it limited. In combination with the much reduced overall signal routing, the power consumption will be always much better than for synchronous systems.

The use of Gray coded counters reduces the number of counter transitions, since the Gray code changes only 1 bit per counting action. The normal binary counter toggles on average 2 bits (for long counters). Thus the use of Gray coding is attractive for power consumption.

The latches employed in the counters should be fast. Sometimes a distinction is made between dynamic and static latches and flip-flops. The memory in a dynamic latch is made of capacitance only. Thus the value contained in the capacitor may be affected by leakage, so that performance at low speeds suffers. Also, a signal that is stored and is not 'really' 0 or 1 will not be restored. For this reason a static latch or flip-flop uses active positive feedback. Such feedback makes sure that all signals are defined in all conditions.

Figure 20:
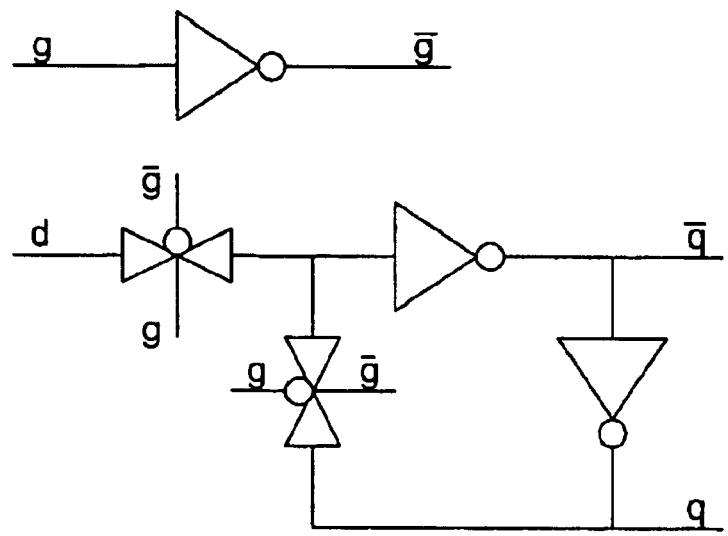
FIG. 20 is a schematic diagram of a fast static latch.

An example of a static latch, including its clock driver is shown in FIG. 20. The point in the circuit directly behind the transmission gates is almost never undriven. Depending on design details the switch over from one gate open to the other gate open may give a glitch of 'no-feedback'. This will be effectively covered by the capacitances in the circuit.

The capacitance in the circuit is not quite minimal. The circuit shown in FIG. 20 uses eight transistors for the actual latch and at least two for the clock driver. The clock driver can also be used for other latches, but the 8 transistors are pretty much the minimum. It is desirable to minimize the number of transistors.

The propagation of the clock through the circuit is not time-minimal. Because there is also direct control over events from for instance master latches, this is not desirable. It would be possible to take the output of the transmission gates as normal latch output, but that would degrade drive performance, which is again not desirable. Instead it would be desirable to have the performance of a single inverter or something in that order of magnitude.

Figure 21:
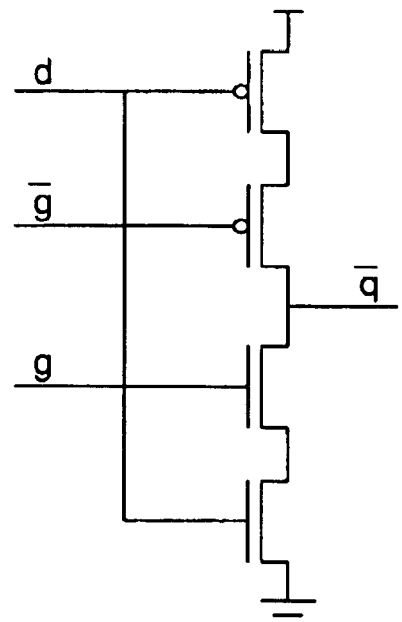
FIG. 21 shows an alternative form of latch.

These problems can be reduced by taking advantage of the fact that the function of the latch is more or less equal to letting a value pass under control of a gate signal. This can also be implemented with another, transistor, as shown in FIG. 21, which is a schematic showing a tristating latch. The clocks perform essentially as a single inverter. If the transistors connected to the input d are sized properly (larger than the transistors on the gate signals) the performance approaches the performance of an inverter. The gate signal transistors are taken on the inside because the clock propagation is the most critical element in asynchronous design. The data delay will be slower (for it needs to pass two transistors), but in an asynchronous system that will typically not turn out to be troublesome. If the data path is very long, and the clock path is relatively short, the input d signal and the gate signals can be exchanged.

The memory is not really present in this cell. However, in CMOS any cell will drive gates of other transistors. These gates will have relatively much capacitance. Thus they can provide the necessary dynamic memory.

Figure 22:
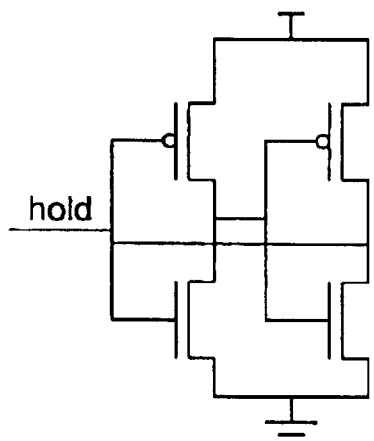
FIG. 22 is a schematic of a tristating latch.

If the cells need to be made static, it is best to not change the cell itself too much. The delay through the cell is quite minimal. An alternative solution is to use "a sticky latch", which is basically not much more than a resistor with a feedback construction. Such a circuit can be made sufficiently resistive that the original latch does not suffer, and of sufficiently low resistance to counter leakage. It can be used to 'pull up' signals to Vdd and Vss. An example of such a circuit is shown in FIG. 22. The two inverters in series together yield positive feedback. The rightmost inverter should use rather long, minimum width transistors, so that they behave as resistors and active part at the same time.

With the tristating latch and the hold cell it is now quite simple to build a master latch and slave latch. A master latch is at least 50% of the time open. If clock gating happens it is even more. Thus there are hardly ever tristate moments. If the clock rate is high enough (say less then 1 ms high period, so more than 500 Hz), the master latch will not be required to be static; its tristate behavior is too limited.

A slave latch that has a guaranteed maximum closed time can also be kept dynamic. However, due to gating this period could be many clock cycles, which in many applications could occur. In such conditions it may be better to make the latch static. This happens by putting a hold cell on the output of the latch cell.

Figure 23:
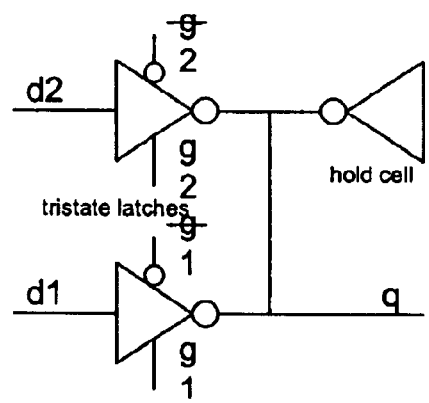
FIG. 23 is a schematic of a double gated slave latch.

The latch is now tristating if not opened. Tristate drivers can simply be put in parallel. Thus a loadable latch can be made by putting two tristate latches in parallel. The direct delay does not change by doing this, only delay due to loading. This typically will have a smaller impact. A complete double gated slave latch as shown in FIG. 23.

Figure 24:
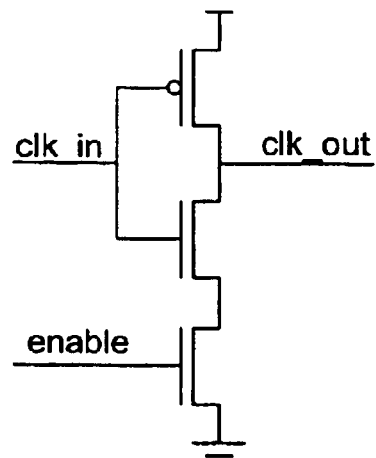
FIG. 24 is a schematic of a clock gate.

The clock gates have partial dynamic behavior. If the clock has an operating frequency above 500 Hz, the enabling of the clock will always be short. Thus the disabling by another signal of that clock will also be short, so that a transistor can be skipped. In FIG. 24, this is shown for the clock_NAND. This circuit is in principle sufficient to generate the correct NAND function. Due to its reduced transistor count it may be a slightly faster and use less power.

While many non-limiting examples the invention, it will be readily understood by one skilled in the art that many other variants are possible within the scope of the invention.

I claim:

1. A high speed digital ripple counter comprising:
   a chain of counter cells comprising a first counter cell and a series of subsequent counter cells, each of said first counter cell and said subsequent counter cells comprising a flip-flop having a master latch and slave latch, each said master and slave latch being provided with data and gating inputs;
   each said subsequent counter cell including a gating circuit having an output supplying gated clock signals to the gating inputs of the master and slave latches associated with that counter cell;
   each said gating circuit of said subsequent counter cells having a first input connected to receive signals applied to the gating inputs of the preceding counter cell and an enable input connected to an output of the master latch of the preceding counter cell; and
   a clock input for providing clock signals to the gating inputs of said first counter cell.

2. The high speed digital ripple counter of claim 1, wherein the enable input of each said gating circuit is taken from the q or $\bar{q}$ output of the master latch of the that counter cell.

3. The high speed digital ripple counter of claim 1, wherein said gating circuits of said counter cells alternately comprise NAND gates and NOR gates.

4. The high speed digital ripple counter of claim 1, wherein said slave latch of each said counter cell has an extra gating input and an extra data input.

5. The high speed digital ripple counter of claim 4, wherein each said counter cell has a load input coupled to said extra gating input of said slave latch and a signal input coupled to said extra data input of said slave latch.

6. The high speed digital ripple counter of claim 5, wherein said load input is also coupled to an extra input of the gating circuit for the following counter cell.

7. The high speed digital ripple counter of claim 6, wherein said load input is coupled to said extra input of said clock gating circuit for the following counter cell through an inverter.

8. The high speed digital ripple counter of claim 7, wherein an output of said inverter provides a load output for the associated counter cell.

9. The high speed digital ripple counter of claim 5, wherein said signal input is coupled to said extra data input through an inverter.

10. The high speed digital ripple counter of claim 5, wherein each counter cell comprises an extra slave latch receiving a data input coupled to a carry bit input and a gating input receiving the gating signals for the counter cell input.

11. The high speed digital ripple counter of claim 10, wherein each said extra slave latch has a second gating input coupled to said load input and a second data input receiving a carry bit ripple signal.

12. The high speed digital counter of claim 11, wherein each counter cell has a carry bit ripple input coupled to said extra data input of said extra slave latch through a first gate circuit.

13. The high speed digital ripple counter of claim 12, wherein said first gate circuit is a NOR gate having a second input coupled to said signal input.

14. The high speed digital ripple counter of claim 12, wherein said carry bit input is coupled to said data input of said extra slave latch through a second gate circuit.

15. The high speed digital ripple counter of claim 14, wherein second gate circuit is a NAND gate having a second input connected to said data input of said slave latch.

16. The high speed digital ripple counter of claim 10, wherein said chain of counter cells includes an end counter cell terminating said chain, said end counter cell comprising:
   an end cell master latch;
   an end cell slave latch having a data input, a gating input, an extra data input, and an extra gating input;
   an end cell extra slave latch having a data input and a gating input;

an end cell signal input;

a clock input;

an end cell carry bit input; and said data input of said end cell slave latch being coupled to an output of said end cell master latch, said extra data input of said end cell slave latch being coupled to said end cell signal input, said second gating input of said end cell slave latch being coupled to said load input, said data input of said end cell extra slave latch being coupled to said carry bit input, and said gating input of said end cell extra slave latch being coupled to said gating input of said end cell slave latch.

17. The high speed digital ripple counter of claim 16 wherein said carry bit input is coupled to said data input of said extra slave latch through a NAND gate.

18. The high speed digital ripple counter of claim 1, wherein said master and slave latches are tristate latches.

* * * * *